US006998156B2

(12) United States Patent  
Bubb et al.

(10) Patent No.: US 6,998,156 B2  
(45) Date of Patent: Feb. 14, 2006

(54) DEPOSITION OF THIN FILMS USING AN INFRARED LASER

(75) Inventors: Daniel Bubb, Beltsville, MD (US); James Horwitz, Fairfax, VA (US); John Callahan, Springfield, VA (US); Richard Haglund, Jr., Brentwood, TN (US); Michael Papantonakis, Nashville, TN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 91 days.

(21) Appl. No.: 10/059,978

(22) Filed: Jan. 29, 2002

(65) Prior Publication Data

US 2003/0143326 A1   Jul. 31, 2003

(51) Int. Cl.
C23C 14/28 (2006.01)
C23C 14/32 (2006.01)
B23K 26/40 (2006.01)
(52) U.S. Cl. .................. 427/596; 427/561; 219/121.85
(58) Field of Classification Search ................ 427/595, 427/596, 597, 561; 219/121.85, 121.61, 219/121.62
See application file for complete search history.

(56) References Cited

U.S. PATENT DOCUMENTS

| 5,002,798 | A | * | 3/1991 | Donley et al. |
| 5,192,580 | A | * | 3/1993 | Blanchet-Fincher ........ 427/596 |
| 5,304,406 | A | * | 4/1994 | Hongo ....................... 427/554 |
| 5,747,120 | A | * | 5/1998 | McLean, II et al. ........ 427/596 |
| 6,156,030 | A | * | 12/2000 | Neev ........................... 427/596 |
| 6,177,151 | B1 | * | 1/2001 | Chrisey et al. ............. 427/561 |
| 6,426,226 | B1 | * | 7/2002 | Senkan ....................... 436/37 |
| 6,576,869 | B1 | * | 6/2003 | Gower et al. ........... 219/121.71 |
| 6,645,843 | B1 | * | 11/2003 | Kim et al. ................... 438/608 |
| 6,805,918 | B1 | * | 10/2004 | Auyeung et al. ........... 427/596 |
| 6,815,015 | B1 | * | 11/2004 | Young et al. ............... 427/596 |
| 6,825,045 | B1 | * | 11/2004 | Haglund et al. ............ 436/174 |
| 2002/0076824 | A1 | * | 6/2002 | Haglund et al. ............ 436/174 |
| 2002/0122898 | A1 | * | 9/2002 | Ringeisen et al. .......... 427/597 |
| 2002/0125230 | A1 | * | 9/2002 | Haight et al. .......... 219/121.69 |
| 2005/0164016 | A1 | * | 7/2005 | Branagan et al. ........... 428/446 |

* cited by examiner

Primary Examiner—Marianne Padgett  
(74) Attorney, Agent, or Firm—John J. Karasek; George A. Kap

(57) ABSTRACT

This invention pertains to transfer of a solid target material onto a substrate by vaporizing the material by irradiating it with intense light of a resonant vibrational mode of the material and depositing the vaporized material on a substrate in a solid form.

11 Claims, 8 Drawing Sheets

DEPOSITION OF THIN FILMS USING AN INFRARED LASER

BACKGROUND OF THE INVENTION

1. Field of the Invention

This invention pertains to evaporating a solid target material by means of a laser that is resonant with a vibrational mode in the material and depositing the material on a substrate.

2. Description of Related Art

Infrared pulsed laser deposition (PLD) was first reported in 1960's but did not emerge as a thin film coating technology at that time for number of reasons. These include the slow repetition rate of the available lasers, and the lack of commercially available high power lasers. At that time, infrared PLD used infrared laser light of 1.06 $\mu$m which was not resonant with any single photon absorption band of the material being deposited. Although PLD developed through the years it was not until late 1980's that ultraviolet PLD became popular with the discovery of complex superconducting ceramics and the commercial availability of high energy, high repetition rate lasers. Ultravioler PLD is now a common laboratory technique used for the production of a broad range of thin film materials.

Ultraviolet PLD has been an extremely successful technique for the deposition of thin films of a large variety of complex, multi-component inorganic materials. Ultraviolet PLD has also been applied to the growth of thin polymeric and organic films, with varying degrees of success. It has been shown that polymethyl methacrylate, polytetrafluoroethylene and polyalphamethyl styrene undergo rapid depolymerization during ultraviolet laser ablation, with the monomer of each strongly present in the ablation plume. The photochemical modification occurs because the energy of the ultraviolet laser causes the irradiated material to be electronically excited. The geometry of the excited electronic state can be very different from the ground electronic state. Relaxation of the excited state can be to either the ground state of the starting material, or a the ground state of a geometrically different material. Deposited films are therefore photochemically modified from the starting material, showing a dramatic reduction in the number average molecular weight. For these polymers, depositing the film at an elevated substrate temperature can increase the molecular weight distribution of the deposited thin film material. On arrival, monomeric material repolymerizes on the heated substrate surface, with degree of repolymerization being determined by the thermal activity of the surface. Therefore, even in some of the most successful cases of ultraviolet PLD, the intense interaction between the target material and laser leads to chemical modification of the polymer.

An alternative approach to PLD of polymeric materials with ultraviolet lasers is matrix-assisted pulsed laser evaporation, disclosed in U.S. Pat. No. 6,025,036 and others, in which roughly 0.1–1% of a polymer material to be deposited is dissolved in an appropriate solvent an frozen to form an ablation target. The ultraviolet laser light interacts mostly with the solvent and the guest material is evaporated much more gently than in conventional PLD. While this technique can produce smooth and uniform polymer films, it requires that the polymer of interest be soluble in a non-interacting solvent. Finding a suitable solvent system that is also non-photochemically active is a significant challenge and limits the usefulness of the technique. There are examples where electronic excitation of the solvent/polymer system has been observed to produce undesirable photochemical modification of the polymer, such as reduction in the average weight average molecular weight. An additional disadvantage of the matrix-assisted pulsed laser evaporation is that the deposition rate is about an order of magnitude lower than conventional PLD, which can render matrix-assisted pulsed laser evaporation ineffective for applications that require thick, i.e., greater than about 1 micron, coatings.

The ability to deposit polymeric materials in the form of a thin film is important for a wide range of uses including electronics, chemical sensors, photonics, analytical chemistry and biological sciences and technologies. The term "thin film" is a term of art typically denoting films as thin as a few molecules thick and up to a few microns in thickness, generally from about 10 angstroms to about 1 micron.

An important biomedical application of polymer thin films is for biocompatible polymer thin films on drug particles. The coating serves to both delay and regulate the release of the drug in the body. Two techniques that have been demonstrated in the coating of drug particles which include wet chemical technique and a vapor deposition technique. In the wet chemical technique, the coated particle can be more than 50% coating on weight bases. A coating that minimizes the coating to drug weight ratio is desired for obvious reasons. It is also important to control the thickness of the deposited film since control of the dissolution rate governs the rate of drug delivery. While UVPLD has been used to deposit much thinner (on the order of a few hundred angstroms) coatings on drug particles, the deposition process introduces significant and undesirable chemical modification in the coating material as a consequence of the ultraviolet excitation.

OBJECTS AND BRIEF SUMMARY OF THE INVENTION

It is an object of this invention to transfer a starting target material onto a substrate using resonant infrared excitation of a particular vibrational feature in the target material.

Another object of this invention is to control thickness of the coating material deposited on a substrate down to a precision of about ten angstroms at a thickness ranging from ten angstroms to a few microns.

Another object of this invention is to transfer a solid target material to a substrate without breaking bonds therein.

Another object of this invention is to use an infrared laser to resonantly excite a vibrational mode of a material, either by choosing a fixed frequency laser of the appropriate wavelength or using a tunable coherent light source (e.g. an optical parametric oscillator or amplifier). The excitation coincides with a vibrational absorption band in the infrared absorption spectrum, such that the material remains in the ground electronic state and is not promoted (or excited) to a higher electronic excited state.

Another object of this invention is the transfer of a target material to a substrate. These and other objects of this invention can be accomplished by transferring a target material, particularly a polymeric material, onto a substrate by the use of an infrared laser which is used to resonantantly excite the vibrational modes in order to vaporize the target material and thus transfer it into the gas phase and deposit the vapor onto a substrate with or without photochemical or any other modification of the target material.

BRIEF DESCRIPTION OF THE DRAWINGS

A more complete appreciation of the invention will be readily obtained by reference to the following description of the preferred embodiments and the accompanying drawings wherein.

DETAILED DESCRIPTION OF THE INVENTION

This invention generally pertains to coating surfaces with a layer of a material which has been transported to the vapor phase using resonant vibrational mode PLD. Deposited thin films can be grown to precise thicknesses ranging from angstroms to microns. This technique can be used for a wide range of materials including polymeric thin film materials for application ranging from electronics to biological sciences. The technique is general and can be extended to all organic, organometallic, inorganic, and biological materials or combinations of materials, particularly in the form of thin films, and to any material which can be transferred to a substrate by vaporizing the target material by resonantly exciting a vibrational mode in the material whereby a vapor plume is formed which is deposited typically in the form of a solid thin film on a substrate. In a preferred embodiment, this deposited solid thin film has substantially the same chemical composition and structure as the target material. More specifically, this invention pertains to a method for transferring a starting target material from its starting condition in a solid form, through a vapor state, and depositing the material in a solid state on a substrate that is, preferably, essentially the same as the starting material, the method comprising the steps of:

(a) vaporizing the starting target material by means of light of a wavelength resonant with the vibrational mode of the starting material, as determined from the infrared absorption spectrum of the starting material, and (b) depositing the vaporized material on the substrate in the form of a solid coating.

The procedural aspects of this invention are essentially the same as the conventional PLD method disclosed in U.S. Pat. No. 5,242,706.

Both the excitation light and a vibrational band of the material will have finite bandwidths. A feature of this invention is the overlap between excitation light and a vibrational band. There should be sufficient overlap for the excitation light to excite a vibrational band to cause vaporization of the target material. More typically, the peak of the excitation light is at the same wavelength as the peak of a vibrational band. More preferably, the excitation light has a peak and a bandwidth that avoids, or at least mitigates, the excitation of modes that cause changes to the chemical composition or other changes of the target molecule. Resonant excitation means that a portion of the linewidth of the illuminating light source overlaps with the infrared absorption band of the target material.

In one embodiment, the output of a high power, pulsed infrared laser was tuned to be resonant with a vibrational mode in the material. Resonant excitation and evaporation of the material on a target leads to formation of a plume of the target material and its deposition on a substrate in the form of a solid film, particularly thin film, that has essentially the same chemical composition and structure as the target material.

Resonant infrared laser deposition is unique when compared to conventional PLD in that it takes advantage of the molecular structure of the material and uses mode specific heating to localize and control the deposited laser energy. The highly vibrationally excited material remains in its ground electronic state but has sufficient internal energy to overcome intermolecular binding energy of the material and be transported into the gas phase usually without significant photochemical modification, including rupture of the bonds between repeating units of a polymeric material. If a material is irradiated with higher energy lasers, such as the ultraviolet region, then the bonds between repeating units of a polymeric material, and possibly other bonds in the material, can rupture or react and lead to modification of the material. The mode specific heating of the resonant excitation allows deposition of a wide variety of photochemically and thermally unstable or labile materials in thin film form.

The non-electronic, resonant infrared laser deposition is characterized by the selection of a band in the infrared absorption spectrum of the coating material, particularly polymeric coating material. The operational region in the absorption spectrum corresponds to molecular vibrational states in the approximate region of 100–5000 $cm^{-1}$, particularly the infrared region of 1–15 μm, and especially 2–10 μm. Transfer of sufficient energy to a coating target material is made to cause desorption of the target material and deposition thereof from a vapor state onto a substrate without degradation. Only enough energy is transferred to the target material to keep the material in its ground electronic state and below an excited electronic excited state. One way to determine if the appropriate vibrational energy was injected (e.g. to desorb the material so that it remains at the ground electronic state and below its excited electronic state, and thus does not undergo chemical and structural modification) is to measure the infrared absorption spectrum of the deposited material and compare this spectrum to the spectrum of the original material. If the spectra essentially match, then the material has not undergone any considerable chemical and/or structural modification. If too much energy has been injected, to where the material can be promoted to an excited electronic state then the material can be chemically and/or structurally modified to the point where it is not useful for the intended purpose. Chromatography can be used to determine appearance of photochemical modification in a material. Also, other analytical techniques, such as mass spectrum and NMR, can be used to verify the match between the target and the deposited material.

Stated differently, the appropriate wavelength of light, corresponding to resonant vibrational excitation, can be determined by examining the infrared absorption spectrum of the target material that is to be transferred onto a substrate in solid form via laser evaporation. The infrared spectrum has characteristic absorption bands that are used to identify the chemical structure of the material. The resonant excitation wavelength can be determined by identifying the wavelength associated with one of the absorption bands, and then using a light source, such as a tunable laser in the infrared region or a fixed frequency laser that is resonant with the vibrational absorption band, to deliver the resonant energy to the target material, as by shining the light onto the material. Light of more than one resonant wavelength can be used. Deposition rates of a material vary depending on what resonant wavelength is used and the desired deposition rate can be measured and selected experimentally.

As already noted, thickness of the film deposited on a substrate from a target material by means of a laser tuned to the desired wavelength, can be controlled down to molecular level. This can be done in conjunction with the apparatus of FIG. 1 by counting the the laser pulses. Since every time the laser is fired at the target material, the same amount of vapor is produced and the same amount of the material is deposited on the substrate from the vapor, a certain number of laser pulses will give a predetermined thickness of deposited material on the substrate. For instance, by firing the FEL laser 100 times (100 macropulses) of light at 3.4 $\mu$m at a target material polyethylene glycol of 1450 average molecular weight, a desired thickness of the material can deposited on a substrate maintained at room temperature.

Figure 1:
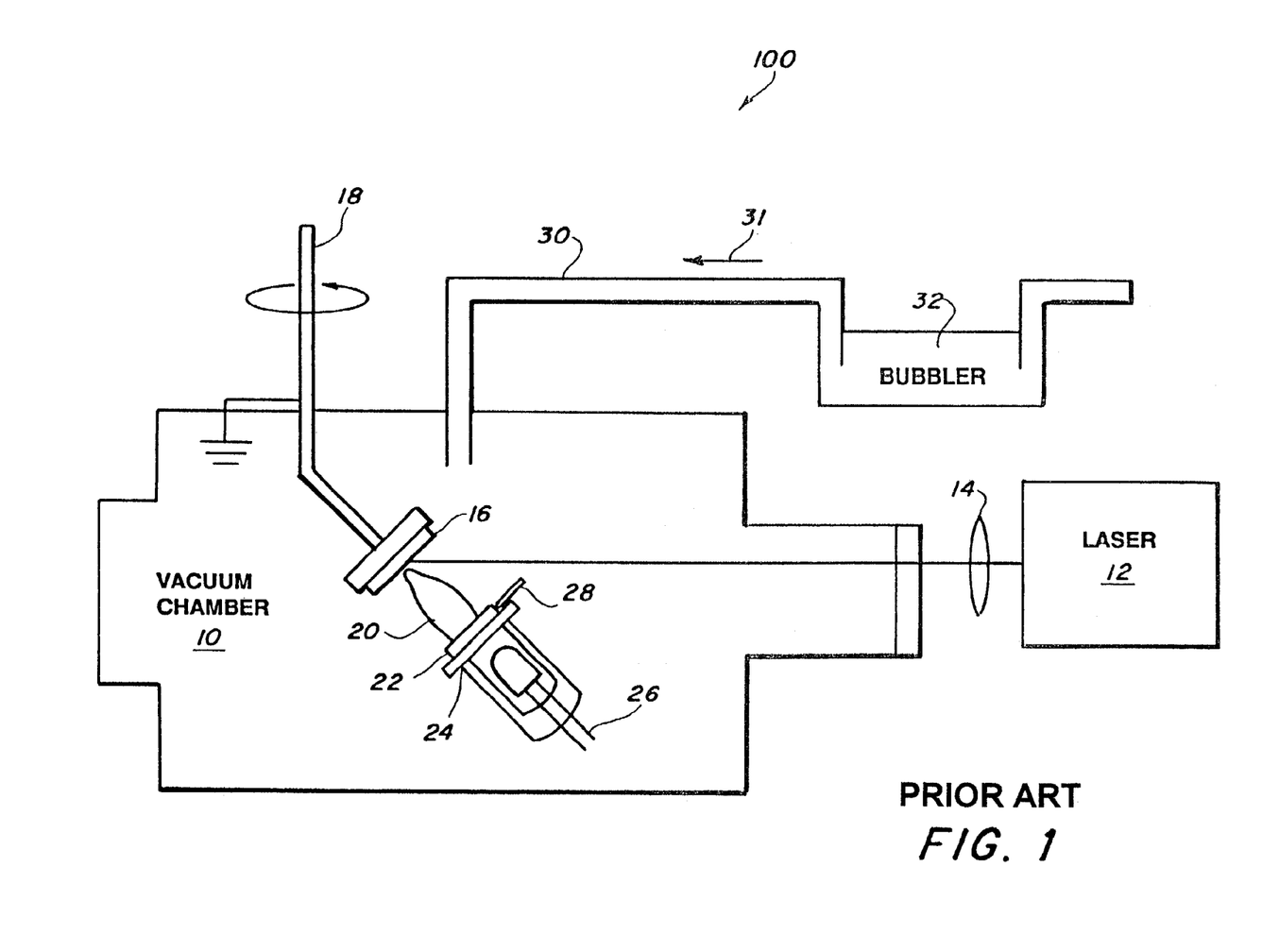
FIG. 1 is a schematic depiction of an apparatus useful in connection with the practice of the present invention.

FIG. 1 shows a typical apparatus useful for carrying out the method of the present invention. Vacuum chamber 10 with a base pressure of about $4 \times 10^{-6}$ Torr encloses the apparatus. Laser 12 is focused through lens 14 onto target 16 made of the target coating material. Target 16 is affixed to rotating arm 18 which allows plume 20 to be processed over substrate 22, thus covering a wider area than a fixed arm geometry would allow. Substrate holder 24 is electrically isolated and may be heated by means of quartz lamp 26. The temperature is monitored by thermocouple 28. Gas inlet port 30 allows the introduction of gases into chamber 10 in the direction of arrow 31. Optional bubbler 32 may be used when a water vapor environment is desired.

The substrate can be of any solid material that can be vaporized by resonant infrared excitation, including organic, especially polymeric materials, inorganic materials, and biological materials. The substrates can be any material that will accept the vapor as a deposited coating and can include planar or non-planar surfaces as well as particles.

The apparatus shown in FIG. 1 can be used to coat substrate surfaces with a thin layer of a polymeric material, or any other material that can be vaporized by application of infrared energy to the target material. The product is a coated substrate wherein the coating is a thin film adhering to the substrate and being essentially the same as the original target material without having undergone any essential chemical and/or structural modification.

A suitable laser light source for resonant infrared pulsed laser deposition is a Free-Electron Laser (FEL) that is continuously tunable in the mid-infrared range of 2–10 $\mu$m or 5,000–1,000 cm$^{-1}$. The present data was collected using the FEL at Vanderbilt University in Nashville, Tenn. The Vanderbilt FEL laser produces an approximately 4 $\mu$s wide macropulse at a repetition rate of 30 Hz. The macropulse is made up of approximately 11,400 1-ps micropulses separated by 350 ps. The energy in each macropulse is on the order of 10 mJ so that the peak unfocused power in each micropulse is very high. The average power of the FEL laser is on the order of 2–3 W. For thin films disposed on a substrate by resonant infrared pulsed laser deposition, as described herein, the fluence is typically between 2 and 3 J/cm$^2$ and typical deposition rate is 100 ng/cm$^2$/macropulse although it is in the range of 1 to 300 ng/cm$^2$/pulse.

Comparison samples were prepared with ultraviolet PLD using an ArF excimer laser as the light source, a Lambda Physik 305 excimer laser operating at a wavelength of 193 nm and FWHM of 30 ns. This laser was operated at a repetition rate of 10 Hz with the fluence varying between 150 and 300 $\mu$J/cm$^2$. The evaporated material was collected on sodium chloride plates and glass microscope slides at room temperature. A typical deposition rate here was 0.01 $\mu$g/cm$^2$/pulse.

In carrying out the experiments described herein, thin films were deposited on sodium chloride substrates whose absorption spectra are shown in FIGS. 2–6. The evaporation targets were solid polymer materials measuring ¾ inch in diameter and ¼ inch thick. The substrates measured 1 cm in diameter and ½ mm in thickness, for the research chamber employed here, although, it should be understood that the substrates can be of any desired size, shape and material. These substrates were used since sodium chloride has no absorptive bands in the infrared region and can therefore be used to determine the infrared absorption spectrum of the deposited thin film.

The films were analyzed using Fourier transform infrared spectroscopy, electrospray ionization and matrix assisted laser desorption and ionization (MALDI) mass spectroscopy. For electrospray ionization and matrix assisted desorption and ionization mass spectrometry, the polyethylene glycol samples were extracted from the surface with 1 ml of methanol and then evaporated to dryness in a vial. The samples were re-dissolved in 25 $\mu$l of methanol.

FIGS. 2–6 pertain to deposition of a thin film of polyethylene glycol of 1450 weight average molecular weight on infrared-transparent (sodium chloride) substrates measuring 1 cm in diameter and ½ mm thick with the coating of the polyethylene glycol on the substrate being from a few 100s of angstroms to several microns using the apparatus of FIG. 1 by the method of conventional PLD using the FEL laser.

Figure 7:
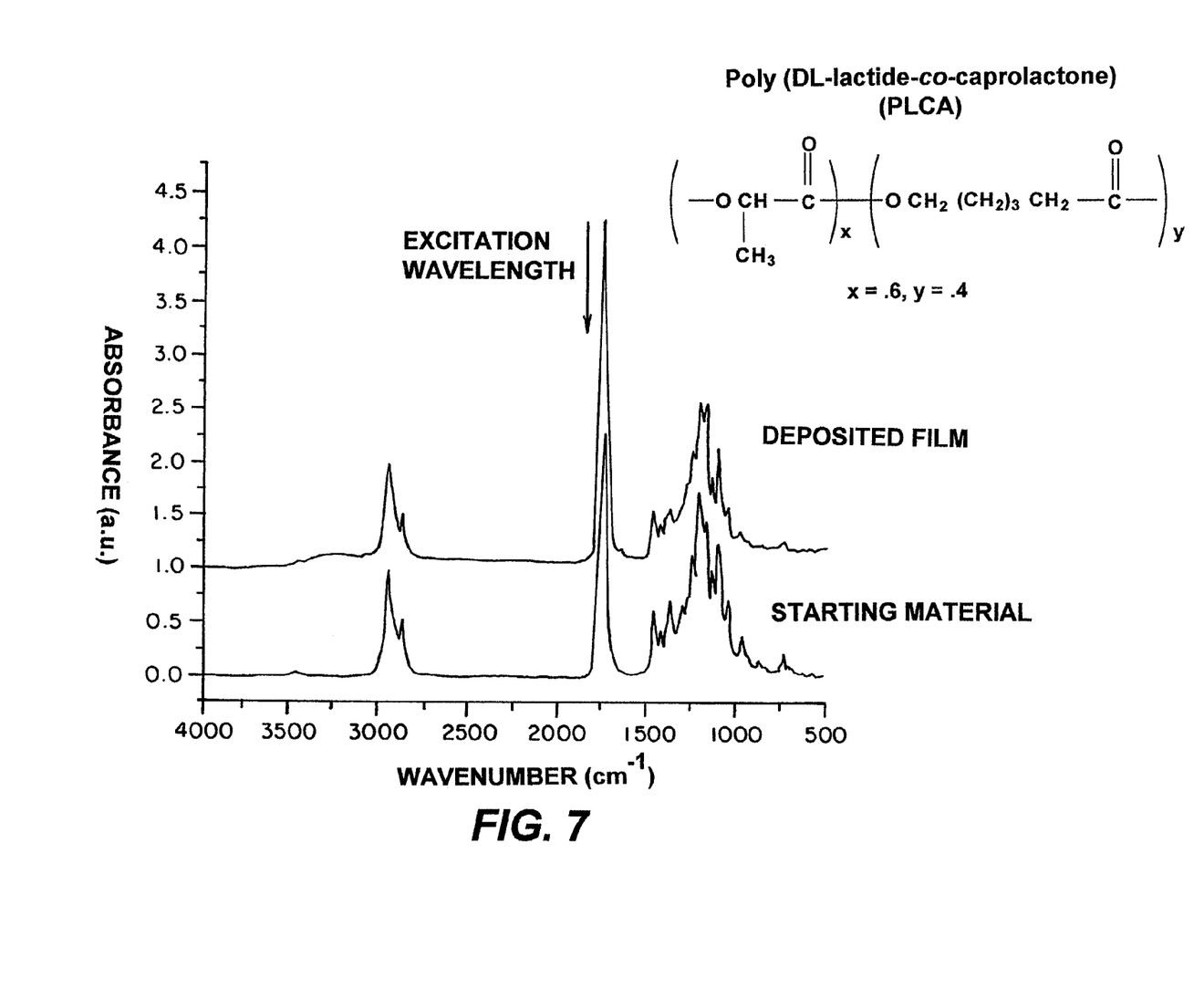
FIG. 7 is a graph of absorption spectra for poly(DL-lactide-co-caprolactone) deposited onto a substrate by means of infrared PLD at 5.7 microns and the infrared absorption spectrum of the target material.

FIG. 7 gives absorption spectra for PLCA target starting material and the material deposited on sodium chloride substrate with resonant excitation at 5.7 $\mu$m.

Figure 8:
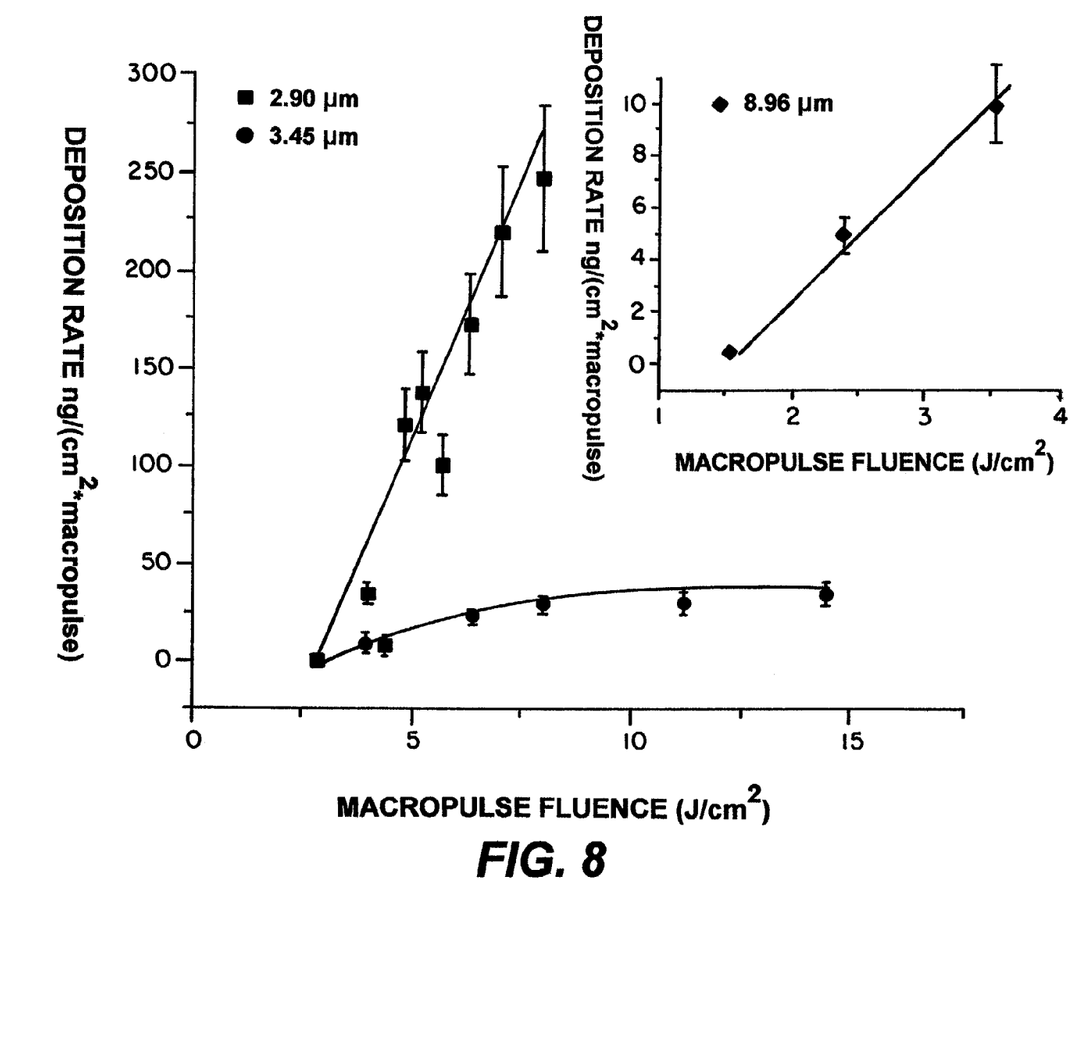
FIG. 8 is a graph showing different deposition rates for resonant excitation bands at 2.9 μm, 3.4 μm and 8.96 μm.

As earlier noted, the deposition rate depends on the resonant wavelength employed and the rate differs from material to material. FIG. 8 shows the deposition rate for polyethylene glycol using the resonant excitation at 2.9 $\mu$m, 3.4 $\mu$m and 8.96 $\mu$m. It appears that the weakest absorption band has the highest evaporation rate. This may be due to deeper penetration depth of the infrared radiation. It was observed in polyethylene glycol, that resonant excitation with light at 2.9 μm results in a higher deposition rate than when using resonant excitation with light of 3.4 μm or 8.96 μm.

Figure 2A:
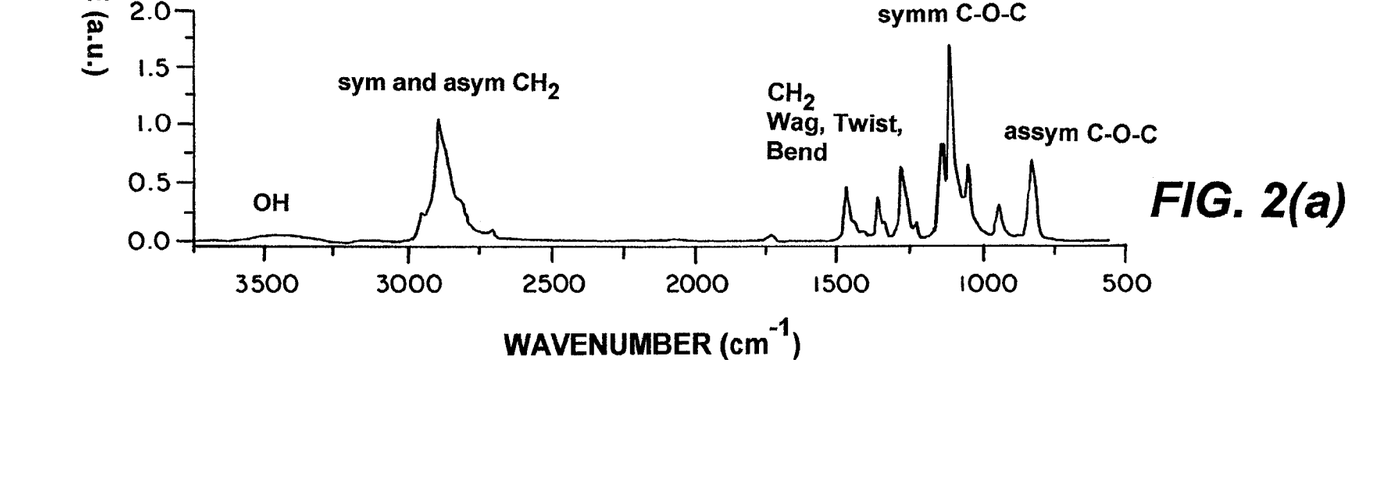
FIG. 2 is a graph of the infrared absorption spectra of polyethylene glycol (MW 1450) starting target material (FIG. 2a), polyethylene glycol thin film transferred onto a substrate with 193 μm ultraviolet excitation (FIG. 2b), and polyethylene thin film transferred onto a substrate with 3.4 μm infrared excitation (FIG. 2c), which is representative of the invention disclosed herein.
Figure 2B:
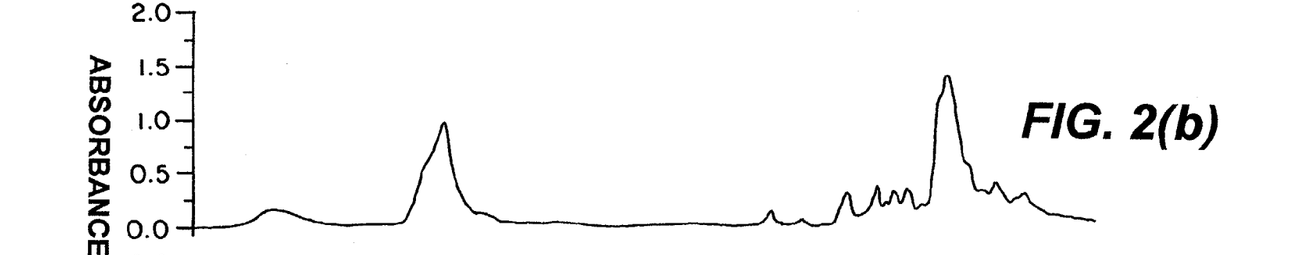
Figure 2C:
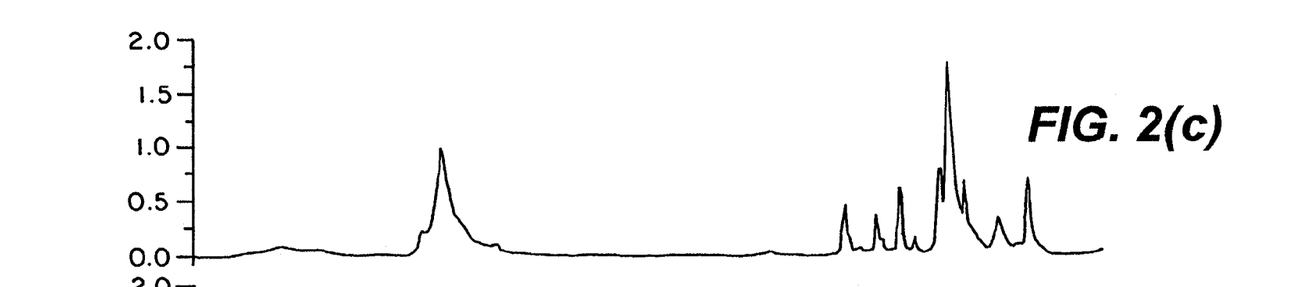

In FIG. 2, which includes FIGS. 2(a), 2(b), and 2(c), the absorption spectra have been normalized to the symmetric stretching feature at 2880 cm$^{-1}$. FIG. 2(a) shows the absorption spectrum of the starting material, FIG. 2(b) shows the absorption spectrum of a thin film of the material deposited on a sodium chloride substrate with ultraviolet light of 193 nm wavelength, and absorption FIG. 2(c) shows the absorption spectrum of a thin film of the material deposited on a sodium chloride substrate with infrared resonant excitation light at 3.4 μm wavelength. At wavelength of 3.4 μm, the infrared laser is resonant, with the C—H stretch of polyethylene glycol hydrocarbon polymeric material.

FIGS. 2(a), 2(b) and 2(b) show the differences in absorption spectra of FIGS. 2(b) and 2(c) as compared to spectrum of FIG. 2(a), i.e., the spectrum of the starting material. The spectrum shown in FIG. 2(c) is nearly identical to the spectrum of FIG. 2(a) whereas there are considerable discrepancies between spectra of FIG. 2(a) and FIG. 2(b). In the FIG. 2(b) spectrum, the OH absorption has increased by a factor of 2.5 relative to the starting material and the material of FIG. 2(c), while the maximum has shifted to a higher energy by 20 cm$^{-1}$. The C—O—C symmetric stretching band at 1110 cm$^{-1}$ has been reduced in intensity and the absorption maximum of the symmetric CH$_2$ has been shifted by −15 cm$^{-1}$ to 2867 cm$^{-1}$. Since spectra of FIGS. 2(a) and 2(c) are essentially identical, the spectra of the materials of FIGS. 2(a) and 2(c) are essentially the same, whereas the spectrum of FIG. 2(b) shows that its material is substantially different from the starting material or that of FIG. 2(c). The spectrum of FIG. 2(b) shows differences that are due to the chemical and/or structural modification.

Figure 3:
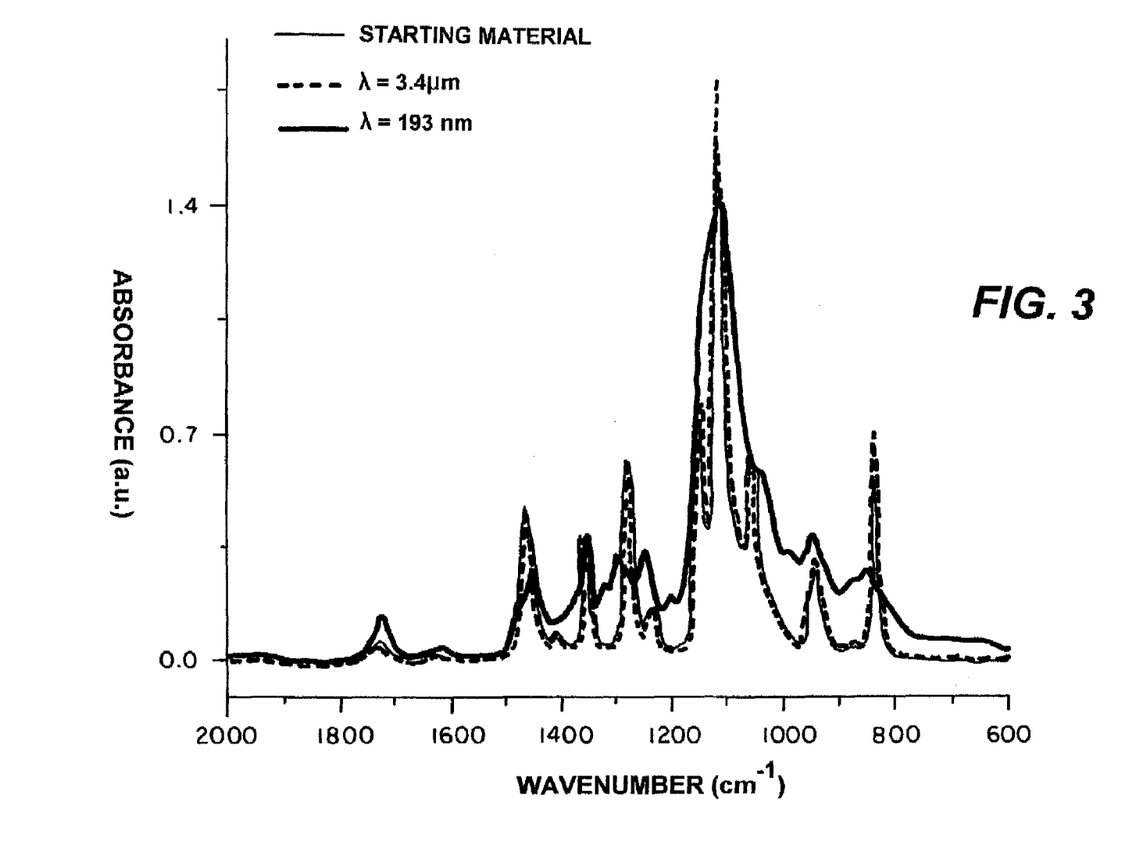
FIG. 3 shows an expanded view of the fingerprint region of the absorption spectrum of FIG. 1 over the wavelength of 2000–600 $cm^{-1}$ with the $CH_2$ wag, twist, and band modes modified significantly in the region of about 1500–600 $cm^{-1}$, where the transferred material is subjected to higher energy ultraviolet excitation.

As shown in FIG. 2(a), which shows absorption spectrum of the starting polyethylene glycol, the OH band has a maximum absorption at about 3400 cm$^{-1}$; the symmetrical and the unsymmetrical CH$_2$ wag, twist and bend have absorption maxima at about the 1250–1500 cm$^{-1}$ vibrational band; the symmetrical C—O—C moiety is at about the 1100 cm$^{-1}$; and the unsymmetrical C—O—C moiety is at about the 600 cm$^{-1}$ spike. FIG. 3 shows an expanded view of the fingerprint region in which the CH$_2$ wag, twist and bend modes are modified significantly in the film deposited using ultraviolet PLD.

Figure 4A:
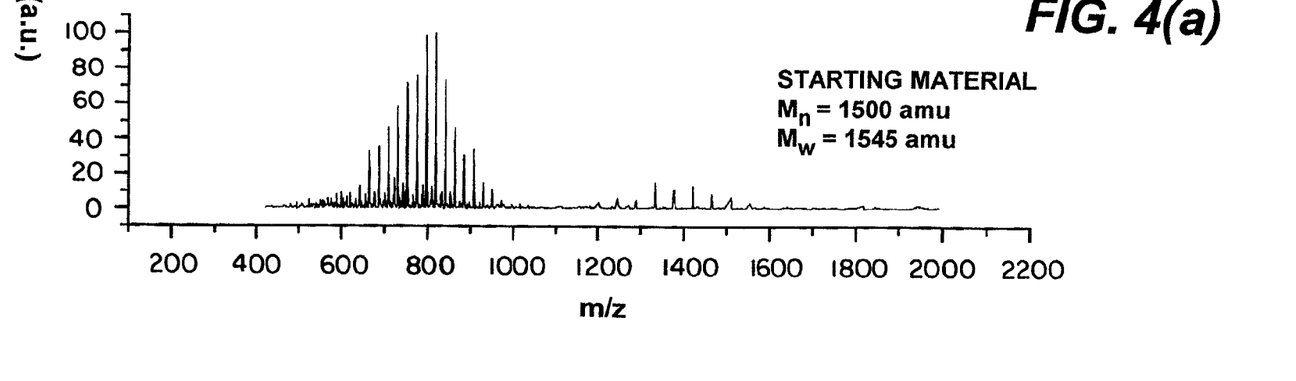
FIG. 4 shows results of electrospray ionization mass spectra for the polyethylene glycol starting material (FIG. 4a), for the starting material transferred onto a substrate by means of PLD with the laser emitting light of 193 μm wavelength (in the ultraviolet region) (FIG. 4b), and for the target material transferred from a target onto a substrate by means of resonant infrared PLD with a laser emitting light of 2.9 μm wavelength in the infrared region (FIG. 4c).
Figure 4B:
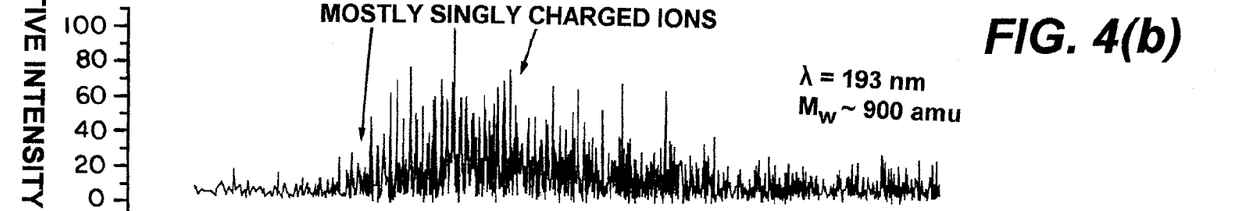
Figure 4C:
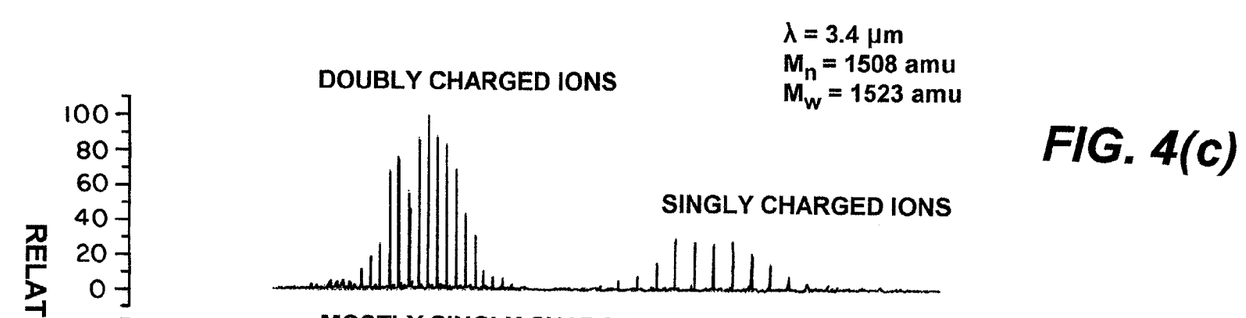

Although both electrospray ionization and matrix assisted laser desorption ionization mass spectrometry were used to determine the molecular weight distributions in the infrared and ultraviolet PLD films, results of only electrospray ionization mass spectrometry are shown in FIG. 4. In FIG. 4(a), results are shown for the starting polyethylene glycol, in FIG. 4(b) results are shown for ultraviolet PLD film and in FIG. 4(c) results for infrared PLD film are shown. In FIG. 4(b), the ultraviolet PLD film shows almost no recognizable pattern relative to the standard in the mass spectrum shown in FIG. 4(a). In contrast, the infrared PLD film of FIG. 4(c) has a very similar mass spectrum to the starting material of FIG. 4(a). By calculation based on the position of the peaks shown in FIGS. 4(a) and 4(c), the mass average for starting material (1538) and the infrared film (2.9 μm=1518; 3.4 μm=1528) are identical to well within one monomer unit (44 amu). Additionally, the number average for the starting material (1500 amu) and infrared PLD films (2.9 μm=1508 amu; 3.4 μm=1507 amu) are similarly close. The polydispersity $M_w/M_n$ for the infrared PLD films, i.e., 1.01–1.05, was nearly the same as the starting material, i.e., 1.03.

The mass and Fourier transform infrared spectroscopy spectra indicated that in the infrared PLD films, the polymer chains were transferred with the same chemical structure as the starting material. This is in contrast to the ultraviolet PLD films in which the initial electronic excitation energy was either converted into heat, which resulted in depolymerization, or electronic excitation resulted in the creation of an excited state with a different geometry that relaxed to the ground state, in a modified form. . If it is in fact the case that the evaporation in the infrared is primarily by a single-photon excitation, the polymer chains must surely have been transferred intact because the photon energy involved, i.e., 0.36–0.42 eV, is far below the energy required for electronic excitation (about 1–3 eV) and direct bond rupture.

Figure 5:
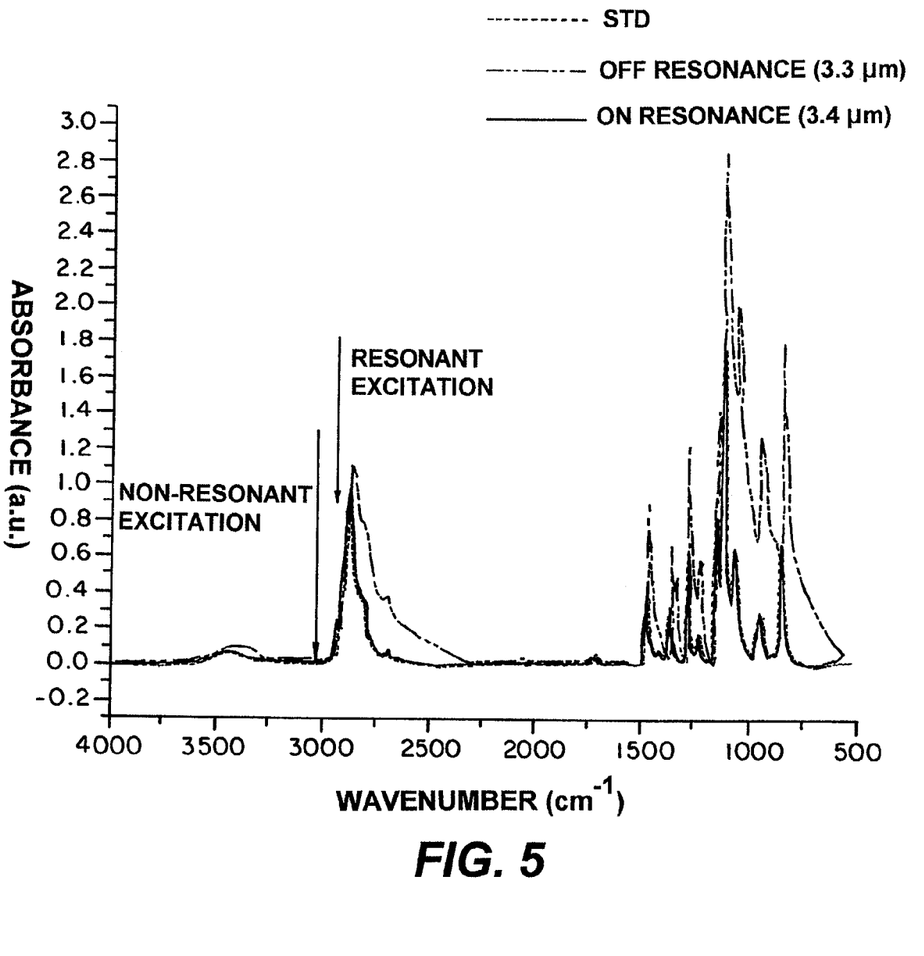
FIG. 5 is a graph of thin film absorption spectra for the target polyethylene glycol transferred onto a substrate by means of infrared PLD using off resonance (3.3 μm) and on resonance (3.4 μm) excitations.
Figure 6:
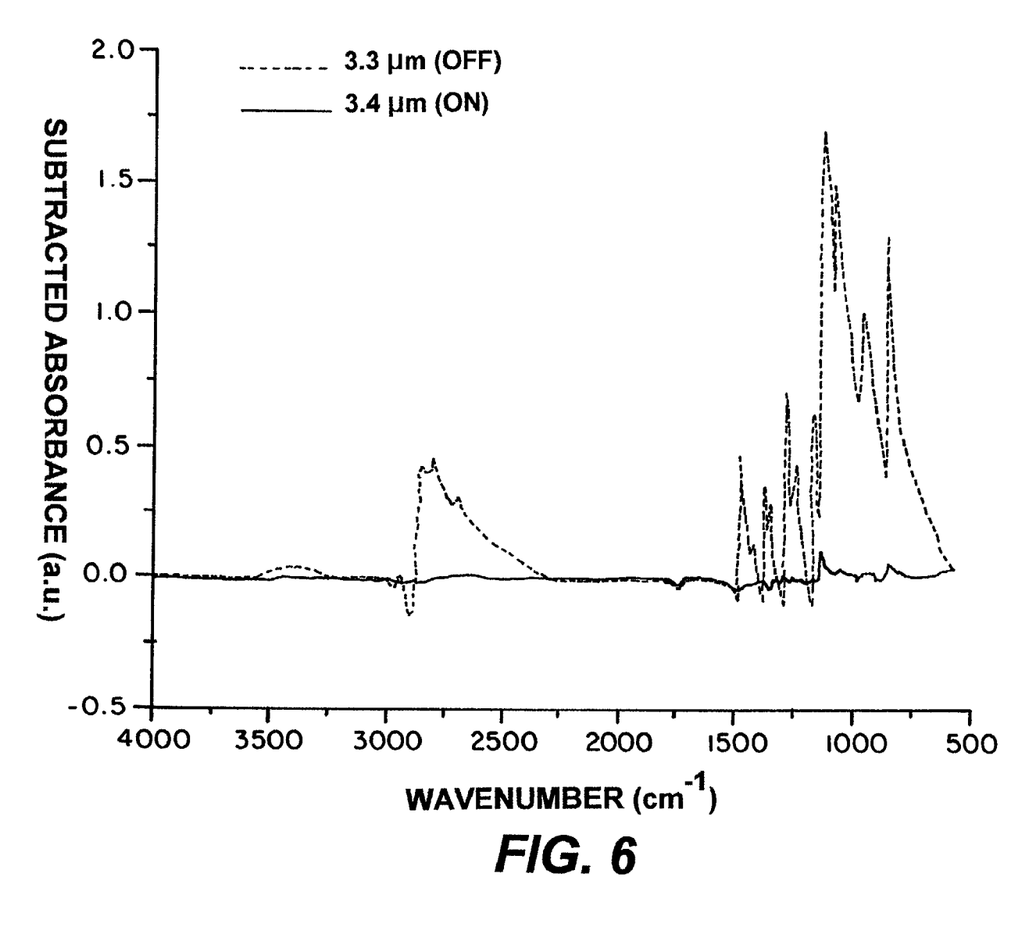
FIG. 6 is a graphic representation of the difference spectra for polyethylene glycol transferred from a target onto a substrate by means of infrared PLD using off resonance (3.3 μm) and on resonance (3.4 μm) excitations.

When the laser was detuned from a resonant vibrational feature, the infrared absorption spectrum was changed significantly from the starting material. Shown in FIG. 5 is the infrared spectrum obtained from polyethylene glycol films deposited on (3.4 μm) and off (3.3 μm) resonance infrared excitation. While the positions of the vibrational bands are similar in the deposited films, as shown in FIG. 5, the relative intensities of the vibrational bands are different. The change in the relative intensities indicates modification of the chemical structure of the polymer. This is further emphasized in FIG. 6 where the difference spectrum for the materials is shown for the two excitation wavelengths, i.e., 3.4 μm and 3.3 μm. The difference spectrum was generated by subtracting the normalized absorption spectrum of the film from the starting material. The difference spectra of FIG. 6 show that for the resonant excitation at 3.4 μm, little change between the starting material and the deposited film is observed in the infrared absorption spectrum for resonant excitation of the polymer, while for the non-resonant case at 3.3 μm, significant changes were observed in the O—H and C—H bands, and large differences in the fingerprint region were observed.

Shown in FIG. 7 are the infrared spectra for a biocompatible polymer poly (DL-lactide-co-caprolactone), (PLCA), which is a co-polymer with an average molecular weight of 67,000 and polydispersity $M_w/M_n$ of about 4. PLCA is similar in structure to poly(lactide co-glocolide), which is currently being investigated for use by the pharmaceutical industry as a sustained drug release coating. The film was deposited on a sodium chloride substrate by the resonant infrared PLD, in the same way as the polyethylene glycol, as previously described. The PLCA film was deposited using 5.7 μm resonant excitation at 1754 cm$^{-1}$. At this wavelength, excitation is localized to the C=O stretch. No significant differences were observed between the spectrum of the starting material and the deposited film.

While presently preferred embodiments have been shown of the novel PLD transfer of polymeric material without its modification, persons skilled in this art will readily appreciate that various additional changes and modification may be made without departing from the spirit of the invention as defined and differentiated by the following claims.

What is claimed:

1. A method for transferring a material onto a substrate comprising the steps of:
    (a) directing light of a wavelength in the infrared region which is resonant with a vibrational mode at a target starting material,
    (b) vaporizing the target material with the light without decomposing, the target material, and
    (c) depositing the vaporized material on a substrate in solid form that is essentially same chemically as the starting target material.

2. The method of claim 1 wherein the vibrational mode is in the infrared region of 1–15 microns.

3. The method of claim 1 wherein the vibrational mode is in the infrared region of 2–10 microns.

4. The method of claim 1 wherein the material is selected from the group consisting of organic, inorganic, biological materials and mixtures thereof.

5. The method of claim 1 wherein the material is polymeric.

6. The method of claim 1 including the steps of subjecting the target and the substrate to an environment selected from the group consisting of sub-atmospheric, atmospheric and above atmospheric pressure and locating the target and the substrate in the vicinity of each other so that the vaporized material from the target can be deposited on the substrate by free fall; and the temperature of the substrate is such that the vaporized material settles on the substrate and becomes solid.

7. The method of claim 6 wherein the environment is sub-atmospheric pressure and the sub-atmospheric pressure is on the order of $4 \times 10^{-8}$ Torr.

8. The method of claim 1 wherein thickness of the coating on the substrate is in the range of about 10 angstroms to 1 micron.

9. The method of claim 8 wherein the light is issued by a tunable pulsed laser and deposition rate of the material on the substrate is in the range of about 1 to 300 mg/cm$^2$/macropulse.

10. The method of claim 1 wherein the light is provided by a laser source delivering a stream of pulses of 100 fs to 5 ms duration at pulse reactivation frequencies ranging from 1 Hz to 3 MHz.

11. The method of claim 10 wherein the laser is operating in a continuous wave mode.

* * * * *

UNITED STATES PATENT AND TRADEMARK OFFICE
CERTIFICATE OF CORRECTION

PATENT NO. : 6,998,156 B2  Page 1 of 1
APPLICATION NO. : 10/059978
DATED : February 14, 2006
INVENTOR(S) : Daniel Bubb et al.

It is certified that error appears in the above-identified patent and that said Letters Patent is hereby corrected as shown below:

Column 8:

Lines 58-67,
-- 1. A method for transferring a material onto a substrate comprising the steps of:
    (a)    directing light of a wavelength in the infrared region which is resonant with a vibrational mode of a target starting material,
    (b)    vaporizing the target starting material with the light without decomposing the target starting material, and
    (c)    depositing the vaporized material on a substrate in solid form that is essentially same chemically as the target starting material. --

Column 9:

Lines 10-18,
-- 6. The method of claim 1 including the steps of subjecting the target starting material and the substrate to an environment selected from the group consisting of subatmospheric, atmospheric and above atmospheric pressure and locating the target starting material and the substrate in the vicinity of each other so that the vaporized material from the target starting material can be deposited on the substrate by free fall; and the temperature of the substrate is such that the vaporized material settles on the substrate and becomes solid. --

Signed and Sealed this

Fifteenth Day of August, 2006

JON W. DUDAS
*Director of the United States Patent and Trademark Office*